United States Patent
Chen et al.

(10) Patent No.: US 11,939,503 B2
(45) Date of Patent: Mar. 26, 2024

(54) METHOD FOR PREPARING MANGANESE-DOPED RED PHOSPHOR, PRODUCT, DEVICE, AND BACKLIGHT MODULE

(71) Applicant: INTELLIGENT MANUFACTURING INSTITUTE OF HEFEI UNIVERSITY OF TECHNOLOGY, Anhui (CN)

(72) Inventors: Lei Chen, Anhui (CN); Peng Cheng, Anhui (CN); Jie Chen, Anhui (CN); Yunfei Tian, Anhui (CN); Jialong Wang, Anhui (CN); Liangrui He, Anhui (CN); Qiuhong Zhang, Anhui (CN); Haiyong Ni, Anhui (CN)

(73) Assignees: Hefei University of Technology, Hefei (CN); Intelligent Manufacturing Institute of HFUT, Hefei (CN)

( * ) Notice: Subject to any disclaimer, the term of this patent is extended or adjusted under 35 U.S.C. 154(b) by 412 days.

(21) Appl. No.: 17/272,349

(22) PCT Filed: Oct. 26, 2018

(86) PCT No.: PCT/CN2018/112158
§ 371 (c)(1),
(2) Date: Apr. 28, 2021

(87) PCT Pub. No.: WO2020/042319
PCT Pub. Date: Mar. 5, 2020

(65) Prior Publication Data
US 2021/0324265 A1    Oct. 21, 2021

(30) Foreign Application Priority Data
Aug. 30, 2018  (CN) .......................... 201811006339.7

(51) Int. Cl.
*C09K 11/67*  (2006.01)
*C09K 11/61*  (2006.01)
(Continued)

(52) U.S. Cl.
CPC .......... *C09K 11/675* (2013.01); *C09K 11/617* (2013.01); *C09K 11/665* (2013.01); *H01L 33/502* (2013.01); *H01L 2933/0041* (2013.01)

(58) Field of Classification Search
CPC ... C09K 11/675; C09K 11/617; C09K 11/665; C09K 11/57; C09K 11/616; H01L 33/502; H01L 2933/0041
See application file for complete search history.

(56) References Cited

U.S. PATENT DOCUMENTS

2016/0133799 A1*  5/2016  Park ..................... C09K 11/617
                                              252/301.4 F
2016/0289553 A1*  10/2016  Beers ..................... C09K 11/57
2017/0040505 A1*  2/2017  You ....................... C09K 11/617

FOREIGN PATENT DOCUMENTS

CN  103980896 A  8/2014
CN  204885214 U  12/2015
(Continued)

OTHER PUBLICATIONS

Congzhi Zhang et al., "Mn4+-dopedfluoride phosphorsrapidly synthesizedby ball milling", OPTICALMATERIALSEXPRESS, Dec. 14, 2017, pp. 73-81.
(Continued)

*Primary Examiner* — Matthew E. Hoban
(74) *Attorney, Agent, or Firm* — Samson G. Yu

(57) ABSTRACT

Disclosed are a preparation method for manganese-doped red phosphor, a device and a backlight module including the product. The method includes: 1) mixing $A_2BF_6$ polycrystalline particles with mill balls; 2) mixing $A_2BF_6$ powder
(Continued)

obtained after ball-milling with a hydrofluoric acid for secondary crystallization; 3) filtering out solid particles in $A_2BF_6$ and hydrofluoric acid solution after the secondary crystallization; 4) performing ion exchange between $A_2BF_6$ particles and $A_2BF_6$; and 5) filtering out solid particles to obtain a filter cake, and performing drying treatment to obtain manganese-doped red phosphor.

5 Claims, 4 Drawing Sheets

(51) Int. Cl.
    *C09K 11/66*     (2006.01)
    *H01L 33/50*     (2010.01)

(56) References Cited

FOREIGN PATENT DOCUMENTS

| CN | 105793389 A | 7/2016 |
| CN | 106687562 A | 5/2017 |
| CN | 107955604 A | 4/2018 |

OTHER PUBLICATIONS

Enhai Song et al., "Highly Efficient and Stable Narrow-Band Red Phosphor Cs2SiF6:Mn4+ for High-Power Warm White LED Applications", ACS Photonics, Sep. 16, 2017, pp. 2556-2565.

* cited by examiner

US 11,939,503 B2

METHOD FOR PREPARING MANGANESE-DOPED RED PHOSPHOR, PRODUCT, DEVICE, AND BACKLIGHT MODULE

CROSS REFERENCE TO RELATED APPLICATIONS

This application is a national application of CN201811006339.7, filed on Aug. 30, 2018. The contents of CN201811006339.7 are all hereby incorporated by reference.

TECHNICAL FIELD

The disclosure relates to a preparation method, a product and an application of phosphor, and in particular to a preparation method for manganese-doped red phosphor, a product, a device and a backlight module.

BACKGROUND

With the development of a display technology, new-type display technologies are developed endlessly, such as Organic Light-Emitting Diode (OLED) curved flexible display, a quantum dot display technology, virtual and augmented reality display. However, mainstream displays that are widely used at present are still a liquid crystal display technology that uses Light-Emitting Diode (LED) as a backlight source. Because liquid crystal display is light-emitting passively, an external light source must be used for image display. Therefore, the luminous quality of the backlight source often determines the quality of a liquid crystal display image.

LED has the advantages of high energy efficiency, low energy consumption, high reliability, long service life, small size and the like. LED is a very excellent backlight source for liquid crystal displays, and the white light LED used for the display backlight source mainly uses a blue light chip to excite a fluorescence conversion-type LED device packaged by red and green phosphor. A color picture of a liquid crystal display is realized through R, G, B color filters. In order to improve a color gamut range and a color saturation of the liquid crystal display, red, green, and blue spectral ranges of the backlight source should be matched with a range of the corresponding display filter. Therefore, the development of wide color gamut and high color saturation display requires the development of a narrow-band LED fluorescent material which is matched with the display filter, especially red and green narrow-band fluorescent materials suitable for blue chip excitation.

Compared with the parity-allowed f-d transition of $Eu^{2+}$ or $Ce^{3+}$, d-d transition emission of Me which is parity-forbidden has a narrower spectral range. Therefore, the use of red emission of the $Mn^{4+}$ is expected to broaden the color gamut. Furthermore, phonon energy of a fluoride system is low, so the fluoride system activated by the $Mn^{4+}$ is expected to produce high-efficiency luminescence. The fluoride activated by the Me is good red phosphor for the display backlight source. However, the fluoride red phosphor currently used in the display backlight source mainly includes $K_2SiF_6:Mn^{4+}$ and $K_2GeF_6:Mn^{4+}$ two systems.

$K_2TiF_6:Mn^{4+}$ also emits light under the excitation of 450 nm to 460 nm of blue light, but due to the low external quantum efficiency of $K_2TiF_6:Mn^{4+}$, the $K_2TiF_6:Mn^{4+}$ red phosphor is not commercialized all the time. A document (Nature Communications, 2014, 5:4312) and a patent with a patent document number CN103980896A disclose that while the Mn concentration is 1.40%, the internal quantum efficiency of $K_2TiF_6:Mn^{4+}$ reaches 98% maximally and the absorption rate is only 36% (the corresponding external quantum efficiency is 35.28%); and while the Me concentration is 6.50%, the absorption rate reaches 60% but the internal quantum efficiency is only 78% (the corresponding external quantum efficiency is 46.8%). It is reported by a document (Optical Materials Express, 2018, 8(1): 73) that the internal quantum efficiency of $K_2TiF_6:Mn^{4+}$ synthesized by ball-milling at 100 RPMs for 15 minutes is 62.5%, and the maximum external quantum efficiency is 47% (namely, the absorption rate is 75.2%). It is reported by a document (Optical Materials Express, 2018, 8(1): 73) that the maximum internal quantum efficiency of $K_2TiF_6:Mn^{4+}$ synthesized by ball-milling at 100 RPMs for 5 minutes is 65.9%, and the external quantum efficiency is 42.8%. It is reported by a document (J. Mater. Chem. C, 2015, 3, 1935) that the internal quantum efficiency of $K_2TiF_6:Mn^{4+}$ red powder is 98%, but a diffuse reflectance spectrum in FIG. 5 of the document shows that the absorption rate of the phosphor thereof is only about 20% (namely, the external quantum efficiency is about 19.6%). It is reported by a document (J. Mater. Sci: Mater. Electron. 2018, 29:12536) that the internal quantum efficiency of $K_2TiF_6:Mn^{4+}$@NaF is 99.19%±0.03%, but the external quantum efficiency is unknown. It is reported by a document (Journal of Materials Science Materials in Electronics, 2017, 28(16):11878) that the internal quantum efficiency of $K_2TiF_6:Mn^{4+}$ reaches 94.04%, and the external quantum efficiency is unknown. It is reported by a document (Materials Research Bulletin, 2016, 83:316) that the internal quantum efficiency of $K_2TiF_6:Mn^{4+}$ reaches 99%, and the external quantum efficiency is unknown. It is reported by a document (J. Lumin. 2017, 188:307) that the internal quantum efficiency of $K_2TiF_6.BaF(HF):Mn^{4+}$ is 60.75%±0.03%, and the external quantum efficiency is unknown. It is reported by a document (ECS J. Solid State Sci. Tech. 2018, 7: R3006) that the internal quantum efficiency of $K_2TiF_6:Mn^{4+}$ is 62%, and the external quantum efficiency is unknown. A patent with a patent document number CN106221694A discloses that the internal quantum efficiency of $K_{1.8}Ba_{0.1}Ti_{0.95}F_6:0.05Mn^{4+}$ is at most 98%, and the external quantum efficiency is unknown. A patent with a patent document number CN106479485A discloses that the internal quantum efficiency of $K_{1.8}Cu_{0.1}Ti_{0.95}F_6:0.05Mn^{4+}$ is at most 98%, and the external quantum efficiency is unknown. A patent with a patent document number CN106318373A discloses a synthesis method suitable for $K_2SiF_6:Mn^{4+}$, $K_2GeF_6:Mn^{4+}$ and $K_2TiF_6:Mn^{4+}$ red phosphor, but the patent does not provide internal and external quantum efficiency parameters, it is judged from FIG. 9 in Embodiments 1 to 3 that the internal quantum efficiency of the $K_2TiF_6:Mn^{4+}$ red phosphor synthesized by using this method of the patent is far lower than that of $K_2SiF_6:Mn^{4+}$ and $K_2GeF_6:Mn^{4+}$.

Although there are many documents and patents for the research of the synthesis and luminescence properties of the $K_2TiF_6:Mn^{4+}$ red phosphor, the external quantum efficiency of the manganese-doped red phosphor prepared in the prior art is generally 47% or less, therefore, the prior art has a technical problem that the external quantum efficiency of the manganese-doped red phosphor is lower.

SUMMARY

A technical problem to be solved by the disclosure is to provide a preparation method for manganese-doped red phosphor, a product, a device and a backlight module, so as to solve the technical problem in the prior art that the external quantum efficiency of the manganese-doped red phosphor is lower.

The disclosure solves the above technical problem through the following technical schemes.

An embodiment of the disclosure provides a preparation method for manganese-doped red phosphor, and the method includes:
1) $A_2BF_6$ polycrystalline particles are mixed with grinding balls, herein the mass ratio of the $A_2BF_6$ polycrystalline particles to the grinding balls is 1:1 to 1:2.5, and then ball-milling is performed for 30 minutes to 120 minutes, herein A is a monovalent cation, and B is a tetravalent cation;
2) $A_2BF_6$ powder obtained after ball-milling is mixed with a hydrofluoric acid, a mass fraction of the hydrofluoric acid is 30% to 59%, herein the mass ratio of the $A_2BF_6$ powder obtained after ball-milling to the hydrofluoric acid is 1:1 to 2.5:1, and then at a revolving speed of 1 RPM to 1200 RPMs, stirring is performed for 12 hours to 72 hours for secondary crystallization treatment;
3) solid particles in $A_2BF_6$ and hydrofluoric acid solution after the secondary crystallization are filtered out, to obtain $A_2BF_6$ particles after the secondary crystallization;
4) according to the molar ratio of $A_2BF_6$ and $A_2MnF_6$ which is 93:7 to 90:10, the $A_2BF_6$ particles after the secondary crystallization and $A_2MnF_6$ are weighed, and then firstly $A_2MnF_6$ is dissolved in the hydrofluoric acid by mass fraction, the mass fraction of the hydrofluoric acid is 30% to 59%, and then the $A_2BF_6$ is added to a solution comprising $A_2MnF_6$ and hydrofluoric acid, and the stirring is continuously performed for 10 minutes to 360 minutes for ion exchange, herein a ratio of the total mass of $A_2BF_6$ and $A_2MnF_6$ to the mass of the hydrofluoric acid is 1:1 to 4:1; and
5) the solid particles in solution after the ion exchange are filtered out, to obtain a filter cake, and then the filter cake is dried to obtain the manganese-doped red phosphor.

Optionally, a secondary crystallization treatment process in the step 2) is performed in a sealed reactor.

Optionally, the step 3) includes:
under conditions of a vacuum degree of 60 Pa to 200 Pa and a flow rate of 60 L/min to 100 L/min, vacuum suction filtration treatment is performed on the $A_2BF_6$ and hydrofluoric acid solution after the secondary crystallization, to obtain the $A_2BF_6$ particles after the secondary crystallization.

Optionally, a preparation method for $A_2MnF_6$ in the step 4) includes:
A: potassium hydrogen fluoride is dissolved in a hydrofluoric acid, the mass fraction of the hydrofluoric acid is 30% to 59%, herein a mass ratio of the potassium hydrogen fluoride to the hydrofluoric acid is 2:10 to 4:10; and at a revolving speed of 10 RPMs to 1000 RPMs, stirring is performed for 15 minutes to 40 minutes;
B: potassium permanganate is added while stirring, herein a mass ratio of the potassium permanganate to the potassium hydrogen fluoride is 1:5 to 2:5;
C: a hydrogen peroxide is used to titrate the solution after adding the potassium permanganate to be golden yellow, the mass fraction of the hydrogen is 25% to 40%;
D: the titrated solution together with a reactor is put into an ice-water mixture at 0° C. to 5° C. and standing is performed for 15 minutes to 40 minutes, a precipitate is filtered out, and then acetone is used to repeatedly wash the precipitate to be neutral; and
E: the washed precipitate is dried for 1 hour to 4 hours under conditions of a temperature of 60° C. to 90° C. and a vacuum degree of 90 Pa to 500 Pa, to obtain $A_2MnF_6$.

Optionally, the step 5) includes:
under conditions of a vacuum degree of 60 Pa to 200 Pa and a flow rate of 60 L/min to 100 L/min, vacuum suction filtration treatment is performed on the solution after ion exchange, to obtain a filter cake, and then acetone is used to repeatedly wash the filter cake to be neutral, and then the filter cake is dried for 1 hour to 4 hours under conditions of a temperature of 60° C. to 90° C. and a vacuum of 90 Pa to 500 Pa, to obtain the manganese-doped red phosphor.

Optionally, the monovalent cation A includes one or a combination of a group consist of a hydrogen ion, a lithium ion, a sodium ion and a cesium ion; and
the tetravalent cation B includes one or a combination of a group consist of a silicon ion, a germanium ion, a tin ion, and a zirconium ion.

An embodiment of the disclosure further provides a product prepared by any one of the above preparation methods for the manganese-doped red phosphor.

An embodiment of the disclosure further provides a device packaged by a product prepared by any one of the above preparation methods for the manganese-doped red phosphor, the device includes: an excitation source, phosphor, an electrode, a packaging material, and a support, herein,
the electrode is connected with the excitation source;
the phosphor is distributed in the packaging material, and arranged around the excitation source; and
the support carries the excitation source, the electrode, and the packaging material.

An embodiment of the disclosure further provides a backlight module packaged by a product prepared by any one of the above preparation methods for the manganese-doped red phosphor.

Compared with the prior art, the disclosure has the following advantages:
1). The embodiment of the disclosure is applied, through pulverizing the $A_2BF_6$ polycrystalline particles for the secondary crystallization, and adding $A_2BF_6$ to the hydrogen fluoride solution in which $A_2MnF_6$ is dissolved for the ion exchange, the external quantum efficiency of the manganese-doped red phosphor can be improved to 69.09%.
2). The embodiment of the disclosure is applied, the external quantum efficiency of the manganese-doped red phosphor is improved, and less phosphor can be used to achieve the same brightness, and the amount of the phosphor is saved.
3). The embodiment of the disclosure is applied, and a use cost is reduced under a condition that it is similar to a wavelength peak value of the existing $K_2GeF_6:Mn^{4+}$.
4). The particle size of the phosphor prepared after ball-milling and secondary crystallization treatment is highly dispersed, which can further save the amount of the phosphor.

DETAILED DESCRIPTION OF THE EMBODIMENTS

Figure 1:
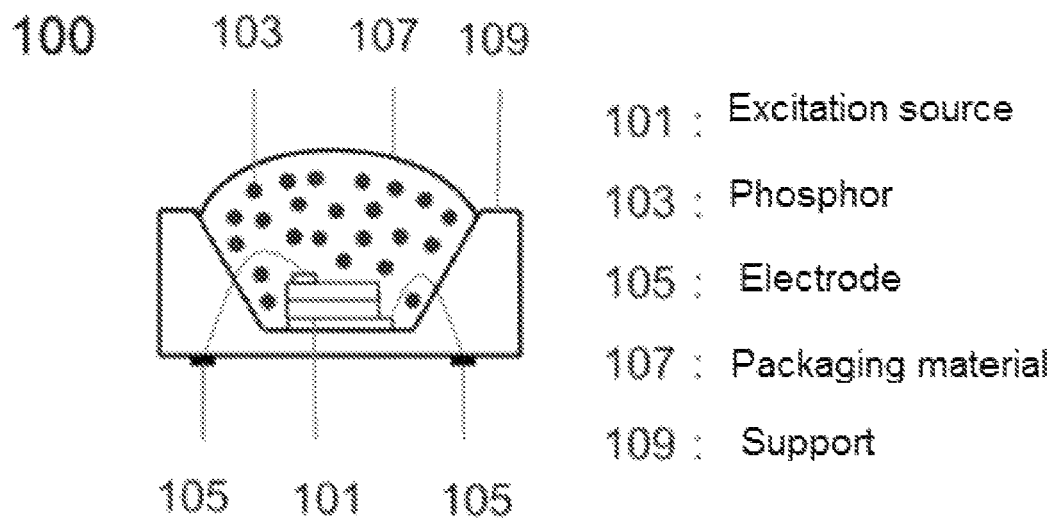
FIG. 1 is a structure schematic diagram of a device packaged by manganese-doped red phosphor provided by an embodiment of the disclosure.

Embodiments of the disclosure are described in detail below. The embodiments are implemented on the premise of technical schemes of the disclosure, and detailed implementation modes and specific operation processes are provided, but a scope of protection of the disclosure is not limited to the following embodiments.

The embodiments of the disclosure provide a preparation method for manganese-doped red phosphor, a product, a device and a backlight module, and the preparation method for the manganese-doped red phosphor provided by the embodiment of the disclosure are firstly introduced below.

An embodiment of the disclosure provides a preparation method for manganese-doped red phosphor, the method includes:

1) $K_2TiF_6$ polycrystalline particles purchased from Aladdin Reagent Network with an article number P112424 were mixed with grinding balls, and the mass ratio of the $K_2TiF_6$ polycrystalline particles to the grinding balls was 1:1. A mixture of the $K_2TiF_6$ polycrystalline particles and the grinding balls was loaded into a polytetrafluoroethylene reactor, and ball-milling was performed for 30 min in a MSK-SFM-3-type high-speed vibration ball mill produced by Hefei Kejing Material Technology Co., Ltd.

2) In the polytetrafluoroethylene reactor, $K_2TiF_6$ powder obtained after ball-milling was mixed with a hydrofluoric acid, the mass fraction of the hydrofluoric acid was 30%, herein the mass ratio of the $K_2TiF_6$ powder obtained after ball-milling to the hydrofluoric acid was 1:1, and the hydrofluoric acid was an analytical pure hydrofluoric acid produced by Tianjin Hengxing Chemical Reagent Manufacture Co., Ltd. Then, the polytetrafluoroethylene reactor was sealed, and an HJ-4A-type digital display temperature controlled magnetic stirrer produced by Changzhou Guoyu Instrument Manufacture Co., Ltd. was used to treat the mixture of the hydrofluoric acid and the $K_2TiF_6$ powder obtained after ball-milling, at a revolving speed of 1 RPM to 1200 RPMs stirring was performed for 12 hours to 72 hours for secondary crystallization treatment.

3) An SHZ-BD(III) polytetrafluoroethylene vacuum filter produced by Yangshen Technology Instrument (Shanghai) Co., Ltd., under conditions of a vacuum degree of 60 Pa to 200 Pa and a flow rate of 60 L/min to 100 L/min, was used to perform vacuum suction filtration treatment on $K_2TiF_6$ and hydrofluoric acid solution after the secondary crystallization, to obtain $K_2TiF_6$ particles after the secondary crystallization.

4) Firstly, $K_2MnF_6$ was prepared according to the following method: A: In a polytetrafluoroethylene beaker, according to the mass ratio of analytical pure potassium hydrogen fluoride produced by Shanghai Sansi Zhuoyue Chemical Co., Ltd. to the hydrofluoric acid which was 2:10 to 4:10, the potassium hydrogen fluoride was dissolved in the hydrofluoric acid, the mass fraction of hydrofluoric acid was 30% to 59%, and at a revolving speed of 10 RPMs to 1000 RPMs, an HJ-4A digital display temperature controlled magnetic stirrer produced by Changzhou Guoyu Instrument Manufacture Co., Ltd. was used to stir for 30 minutes. B: While stirring, analytical pure potassium permanganate produced by Sinopharm Group Chemical Reagent Co., Ltd. (National Pharmaceutical Code 10017308) was added, herein the mass ratio of the potassium permanganate to the potassium hydrogen fluoride was 1:5 to 2:5. C: Analytical pure hydrogen peroxide produced by Sinopharm Group Chemical Reagent Co., Ltd. (National Pharmaceutical Code 10011208) with a mass fraction of 25% to 40% was used to titrate solution after adding the potassium permanganate to be golden yellow, until the color of the solution was not changed along with dropping of the hydrogen peroxide. D: The titrated solution together with a reactor was put into ice-water mixed solution at 0° C. to 5° C. and standing was performed for 15 minutes to 40 minutes, a precipitate is filtered out, and then analytical pure acetone (National Pharmaceutical Code 10000418) produced by Sinopharm Group Chemical Reagent Co., Ltd. was used to repeatedly wash the precipitate to be neutral. E: Then, a DZF-6020 vacuum dryer produced by Shanghai Boxun Industrial Co., Ltd. was used to dry the washed precipitate under conditions of a temperature of 60° C. to 90° C. and a vacuum degree of 90 Pa to 500 Pa for 1 hour to 4 hours, to obtain $K_2MnF_6$.

5) According to the molar ratio of $K_2TiF_6$ to $K_2MnF_6$ which was 93:7 to 90:10, the $K_2TiF_6$ particles after the secondary crystallization and $K_2MnF_6$ were weighed, and then firstly $K_2MnF_6$ was dissolved in the hydrofluoric acid, the mass fraction of the hydrofluoric acid was 30% to 59% and $K_2TiF_6$ was added to solution of $K_2MnF_6$ and hydrofluoric acid, and the stirring was continuously performed for 10 minutes to 360 minutes for ion exchange, herein a ratio of the total mass of $K_2TiF_6$ and $K_2MnF_6$ to the mass of the hydrofluoric acid was 1:1 to 4:1.

6) Under conditions of a vacuum degree 60 Pa to 200 Pa and a flow rate 60 L/min to 100 L/min, vacuum suction filtration treatment was performed on the solution after the ion exchange, to obtain a filter cake, and then the analytical pure acetone (National Pharmaceutical Code 10000418) produced by Sinopharm Group Chemical Reagent Co., Ltd. was used to repeatedly wash the filter cake to be neutral, and then the DZF-6020 vacuum dryer produced by Shanghai Boxun Industrial Co., Ltd., under conditions of a temperature of 60° C. to 90° C. and a vacuum degree of 90 Pa to 500 Pa, was used to dry the filter cake for 1 hour to 4 hours, to obtain the manganese-doped red phosphor, namely $K_2TiF_6:Mn^{4+}$.

An embodiment of the disclosure further provides a product prepared according to the above method.

An embodiment of the disclosure further provides a device packaged by a product prepared according to the above method, and FIG. 1 is a structure schematic diagram of a device packaged by manganese-doped red phosphor provided by an embodiment of the disclosure, as shown in FIG. 1, the device 100 includes: an excitation source 101, phosphor 103, an electrode 105, a packaging material 107 and a support 109, herein, the electrode 105 is connected with the excitation source 101; specifically, the excitation source 101 can be an LED chip;

the phosphor 103 is distributed in the packaging material 107, and arranged around the excitation source 101; specifically, the packaging material 107 can be a transparent silica gel; and the support 109 carries the excitation source 101, the electrode 105, and the packaging material 107.

An embodiment of the disclosure further provides a backlight module packaged by a product prepared according to the above method.

Technical schemes in the embodiments of the disclosure are clearly and completely described below, herein Table 1 is a table of process parameters used in Embodiments 1 to 9 of the disclosure; and Table 2 is a table of process parameters used in Embodiments 10 to 19 of the disclosure; as shown in Table 1 and Table 2.

TABLE 1

| | Embodiment number | 1 | 2 | 3 | 4 | 5 | 6 | 7 | 8 | 9 |
|---|---|---|---|---|---|---|---|---|---|---|
| Step 1 | Ball to material ratio | 1:1 | 1:1 | 1:1 | 1:1 | 1.5:1 | 1.5:1 | 1.5:1 | 1.5:1 | 2:1 |
| | Ball-milling time length (min) | 30 | 60 | 90 | 120 | 30 | 60 | 90 | 120 | 30 |
| Step 2 | Hydrofluoric acid mass fraction (%) | 30 | 35 | 40 | 45 | 50 | 55 | 59 | 30 | 35 |
| | Mass ratio of potassium fluorotitanate to hydrofluoric acid | 1:1 | 1:1.5 | 1:2 | 1:2.5 | 1:2.5 | 1:2 | 1:1.5 | 1:1 | 1:1.5 |
| | Stirring speed (RPM) | 400 | 600 | 800 | 1200 | 800 | 1200 | 400 | 600 | 12000 |
| | Crystallization time length (h) | 24 | 36 | 48 | 60 | 36 | 24 | 60 | 48 | 48 |
| Step 3 | Suction filtration vacuum degree (Pa) | 60 | 70 | 80 | 90 | 100 | 110 | 120 | 130 | 140 |
| | Suction filtration flow rate (L/min) | 60 | 65 | 70 | 75 | 80 | 85 | 90 | 95 | 100 |
| Step 4 | Mass ratio of potassium hydrogen fluoride to hydrofluoric acid | 2:10 | 2.5:10 | 3:10 | 3.5:10 | 4:10 | 2:10 | 2.5:10 | 3:10 | 3.5:10 |
| | Hydrofluoric acid mass fraction (%) | 30 | 35 | 40 | 45 | 50 | 55 | 59 | 30 | 35 |
| | Stirring speed (RPM) | 10 | 20 | 40 | 60 | 80 | 100 | 200 | 300 | 400 |
| | Stirring time length (min) | 15 | 17 | 20 | 22 | 25 | 27 | 30 | 15 | 17 |
| | Mass ratio of potassium permanganate to potassium hydrogen fluoride | 1:5 | 1.2:5 | 1.5:5 | 1.7:5 | 2:5 | 1:5 | 1.2:5 | 1.5:5 | 1.7:5 |
| | Hydrogen peroxide mass fraction (%) | 25 | 27 | 30 | 32 | 35 | 37 | 40 | 25 | 27 |
| | Ice-water mixture temperature (° C.) | 0 | 1 | 2 | 3 | 4 | 5 | 0 | 1 | 2 |
| | Standing time length (min) | 15 | 17 | 20 | 22 | 25 | 27 | 30 | 32 | 35 |
| | Drying temperature (° C.)/ | 60 | 65 | 70 | 75 | 80 | 85 | 90 | 60 | 65 |
| | Drying vacuum degree (Pa) | 90 | 120 | 150 | 180 | 200 | 240 | 280 | 320 | 360 |
| | Drying time length (h) | 1 | 1.2 | 1.4 | 1.6 | 1.8 | 2 | 2.2 | 2.4 | 2.6 |
| Step 5 | Molar ratio of potassium fluorotitanate to potassium fluoromanganate | 90:10 | 91:9 | 92:8 | 93:7 | 90:10 | 91:9 | 92:8 | 93:7 | 90:10 |
| | Hydrofluoric acid mass fraction (%) | 30 | 35 | 40 | 45 | 50 | 55 | 59 | 30 | 35 |
| | Stirring time length (min) | 10 | 20 | 40 | 60 | 80 | 100 | 120 | 140 | 160 |

TABLE 1-continued

| | Embodiment number | 1 | 2 | 3 | 4 | 5 | 6 | 7 | 8 | 9 |
|---|---|---|---|---|---|---|---|---|---|---|
| | Ratio of total mass of potassium fluorotitanate and potassium fluoromanganate to mass of hydrofluoric acid | 1:1 | 1.5:1 | 2:1 | 2.5:1 | 3:1 | 3.5:1 | 4:1 | 1:1 | 1.5:1 |
| Step6 | Suction filtration vacuum degree (Pa) | 60 | 70 | 80 | 90 | 100 | 110 | 120 | 130 | 140 |
| | Suction filtration flow rate (L/min) | 60 | 65 | 70 | 75 | 80 | 85 | 90 | 95 | 100 |
| | Drying temperature (° C.) | 60 | 65 | 70 | 75 | 80 | 85 | 90 | 60 | 65 |
| | Drying vacuum degree (Pa) | 90 | 120 | 150 | 180 | 210 | 240 | 270 | 300 | 330 |
| | Drying time length (h) | 1 | 1.5 | 2 | 2.5 | 3 | 3.5 | 4 | 1 | 1.5 |

TABLE 2

| | Embodiment number | 10 | 11 | 12 | 13 | 14 | 15 | 16 | 17 | 18 | 19 |
|---|---|---|---|---|---|---|---|---|---|---|---|
| Step 1 | Ball to material ratio | 2:1 | 2:1 | 2:1 | 2.5:1 | 2.5:1 | 2.5:1 | 2.5:1 | 2:1 | 2:1 | 2:1 |
| | Ball-milling time length (min) | 60 | 90 | 120 | 30 | 60 | 90 | 120 | 90 | 90 | 90 |
| Step2 | Hydrofluoric acid mass fraction (%) | 40 | 45 | 50 | 55 | 59 | 30 | 35 | 40 | 40 | 40 |
| | Mass ratio of potassium fluorotitanate to hydrofluoric acid | 1:1 | 1:2.5 | 1:2 | 1:2 | 1:2 | 1:1.5 | 1:1.5 | 1:1.5 | 1:1.5 | 1:1.5 |
| | Stirring speed (RPM) | 800 | 600 | 400 | 600 | 400 | 1200 | 800 | 400 | 400 | 400 |
| | Crystallization time length (h) | 60 | 24 | 36 | 60 | 48 | 36 | 24 | 36 | 48 | 60 |
| Step 3 | Suction filtration vacuum degree (Pa) | 150 | 160 | 170 | 180 | 190 | 200 | 190 | 180 | 180 | 180 |
| | Suction filtration flow rate (L/min) | 60 | 65 | 70 | 75 | 80 | 85 | 90 | 95 | 95 | 95 |
| Step4 | Mass ratio of potassium permanganate to potassium hydrogen fluoride | 4:10 | 2:10 | 2.5:10 | 3:10 | 3.5:10 | 4:10 | 2:10 | 2.5:10 | 2.5:10 | 2.5:10 |
| | Hydrofluoric acid mass fraction (%) | 40 | 45 | 50 | 55 | 59 | 30 | 35 | 40 | 40 | 40 |
| | Stirring speed (RPM) | 500 | 600 | 700 | 800 | 900 | 1000 | 900 | 800 | 800 | 800 |
| | Stirring time length (min) | 20 | 22 | 25 | 27 | 30 | 15 | 17 | 20 | 30 | 30 |
| | Mass ratio of potassium permanganate to potassium hydrogen fluoride | 2:5 | 1:5 | 1.2:5 | 1.5:5 | 1.7:5 | 2:5 | 1:5 | 1.2:5 | 1.2:5 | 1.2:5 |
| | Hydrogen peroxide mass fraction (%) | 30 | 32 | 35 | 37 | 40 | 25 | 27 | 30 | 30 | 30 |
| | Ice-water mixture temperature (° C.) | 3 | 4 | 5 | 0 | 1 | 2 | 3 | 4 | 4 | 4 |

TABLE 2-continued

| | Embodiment number | 10 | 11 | 12 | 13 | 14 | 15 | 16 | 17 | 18 | 19 |
|---|---|---|---|---|---|---|---|---|---|---|---|
| | Standing time length (min) | 37 | 40 | 15 | 17 | 20 | 22 | 25 | 27 | | |
| | Drying temperature (° C.) | 70 | 75 | 80 | 85 | 90 | 60 | 65 | 70 | 70 | 70 |
| | Drying vacuum degree (Pa) | 400 | 420 | 440 | 480 | 500 | 90 | 120 | 150 | 150 | 150 |
| | Drying time length (h) | 2.8 | 3 | 3.2 | 3.4 | 3.6 | 3.8 | 4 | 1 | 3 | 3 |
| Step 5 | Molar ratio of potassium fluorotitanate to potassium fluoromanganate | 91:9 | 92:8 | 93:7 | 90:10 | 91:9 | 92:8 | 93:7 | 90:10 | 92:8 | 92:8 |
| | Hydrofluoric acid mass fraction (%) | 40 | 45 | 50 | 55 | 59 | 30 | 35 | 40 | 40 | 40 |
| | Stirring speed (RPM) | 500 | 600 | 700 | 800 | 900 | 1000 | 900 | 800 | 400 | 400 |
| | Stirring time length (min) | 180 | 200 | 220 | 240 | 260 | 280 | 300 | 320 | 340 | 360 |
| | Ratio of total mass of potassium fluorotitanate and potassium fluoromanganate to mass of hydrofluoric acid | 2:1 | 2.5:1 | 3:1 | 3.5:1 | 4:1 | 1:1 | 1.5:1 | 2:1 | 4:1 | 4:1 |
| Step 6 | Suction filtration vacuum degree (Pa) | 150 | 160 | 170 | 180 | 190 | 200 | 190 | 180 | 180 | 180 |
| | Suction filtration flow rate (L/min) | 60 | 65 | 70 | 75 | 80 | 85 | 90 | 95 | 95 | 95 |
| | Drying temperature (° C.) | 70 | 75 | 80 | 85 | 90 | 60 | 65 | 70 | 70 | 70 |
| | Drying vacuum degree (Pa) | 360 | 390 | 420 | 450 | 480 | 500 | 470 | 440 | 440 | 440 |
| | Drying time length (h) | 2 | 2.5 | 3 | 3.5 | 4 | 1 | 1.5 | 4 | 4 | 4 |

Relative Light Intensity Test

An F4600 fluorescence spectrometer produced by Hitachi Manufacture Co., Ltd. is used to test the products prepared in Embodiments 1 to 19, and test results are shown in Table 3.

Table 3 is the test results of luminous intensities, color coordinates, color temperatures and color rendering indexes of the products prepared in Embodiments 1 to 19 provided by the embodiments of the disclosure, herein the relative intensity is obtained by integrating an emission spectrum within a range of 580 nm to 680 nm; and the color coordinates, correlated color temperatures, and color rendering indexes are calculated by using "CIE13_3w.exe" software.

TABLE 3

| | Relative intensity | Color coordinate (x, y) | Correlated color temperature (K) | Color rendering index Ra |
|---|---|---|---|---|
| Embodiment 1 | 55.94242 | (0.6877, 0.3121) | 1000 | 12.03 |
| Embodiment 2 | 89.87714 | (0.6882, 0.3117) | 1000 | 11.63 |
| Embodiment 3 | 84.27215 | (0.6880, 0.3119) | 1000 | 11.36 |
| Embodiment 4 | 50.64414 | (0.6879, 0.3120) | 1000 | 11.24 |
| Embodiment 5 | 80.00677 | (0.6882, 0.3116) | 1000 | 11.64 |
| Embodiment 6 | 67.25242 | (0.6880, 0.3119) | 1000 | 11.67 |
| Embodiment 7 | 94.9639 | (0.6884, 0.3114) | 1000 | 11.13 |
| Embodiment 8 | 57.37577 | (0.6881, 0.3118) | 1000 | 10.47 |
| Embodiment 9 | 82.79778 | (0.6883, 0.3115) | 1000 | 11.36 |
| Embodiment 10 | 100 | (0.6883, 0.3116) | 1000 | 11.15 |
| Embodiment 11 | 92.70986 | (0.6884, 0.3115) | 1000 | 11.12 |
| Embodiment 12 | 83.39078 | (0.6883, 0.3116) | 1000 | 10.95 |
| Embodiment 13 | 74.87309 | (0.6884, 0.3115) | 1000 | 11.34 |
| Embodiment 14 | 81.62602 | (0.6884, 0.3115) | 1000 | 11.19 |
| Embodiment 15 | 85.48093 | (0.6883, 0.3116) | 1000 | 11.17 |
| Embodiment 16 | 62.66306 | (0.6886, 0.3113) | 1000 | 11.10 |
| Embodiment 17 | 82.61542 | (0.6880, 0.3245) | 1000 | 11.15 |
| Embodiment 18 | 84.40983 | (0.6882, 0.3546) | 1000 | 11.19 |
| Embodiment 19 | 73.06636 | (0.6884, 0.1323) | 1000 | 11.14 |

Figure 2:
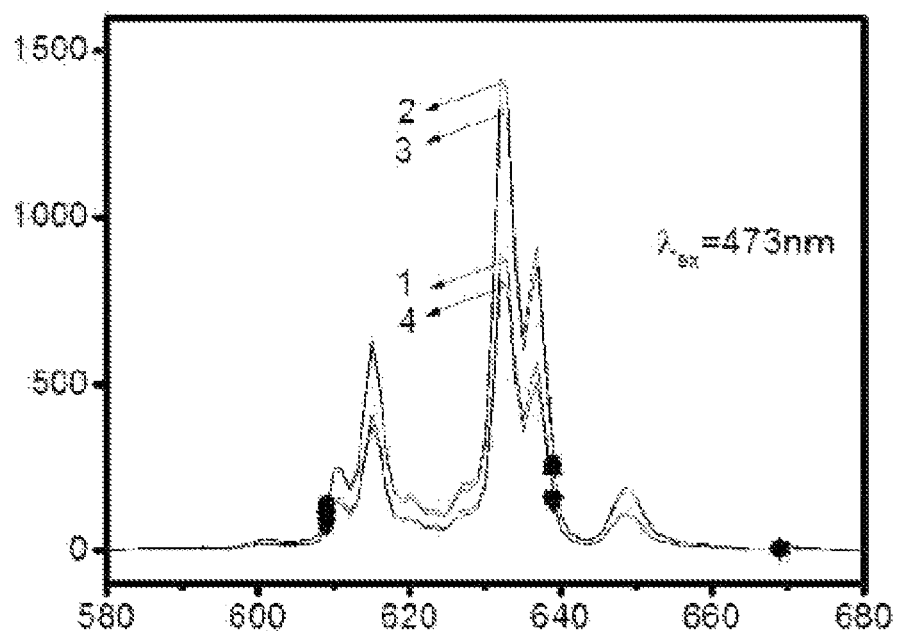
FIG. 2 is a test result of the emission intensity of products prepared in Embodiments 1 to 4 provided by an embodiment of the disclosure.
Figure 3:
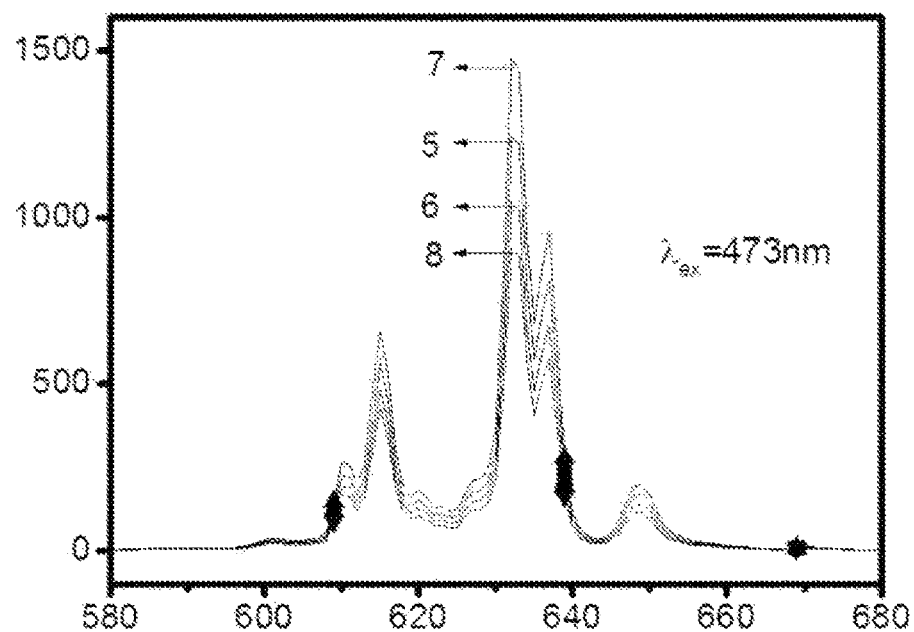
FIG. 3 is a test result of the emission intensity of products prepared in Embodiments 5 to 8 provided by an embodiment of the disclosure.
Figure 4:
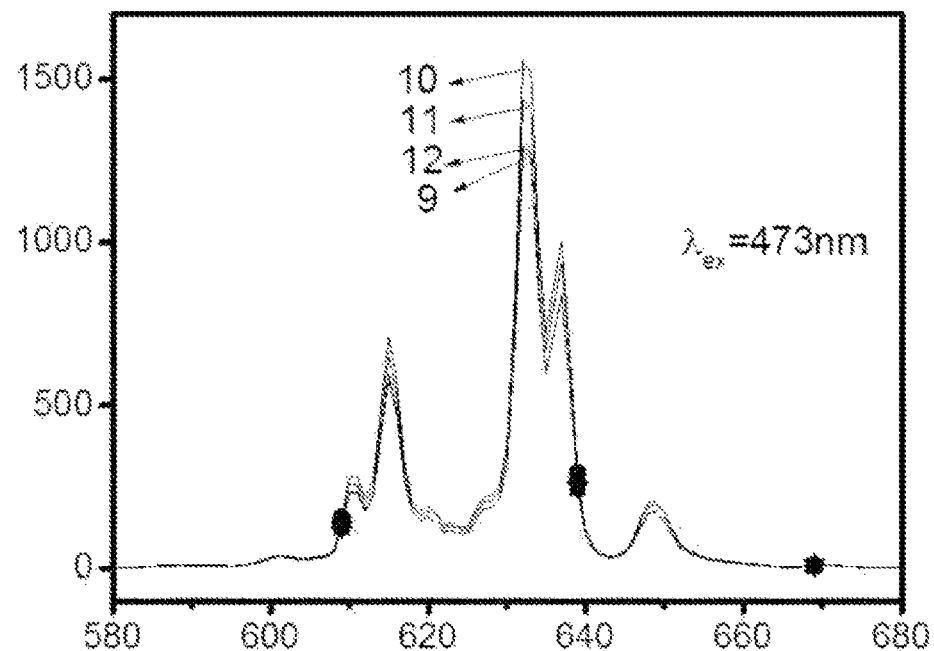
FIG. 4 is a test result of the emission intensity of products prepared in Embodiments 9 to 12 provided by an embodiment of the disclosure.
Figure 5:
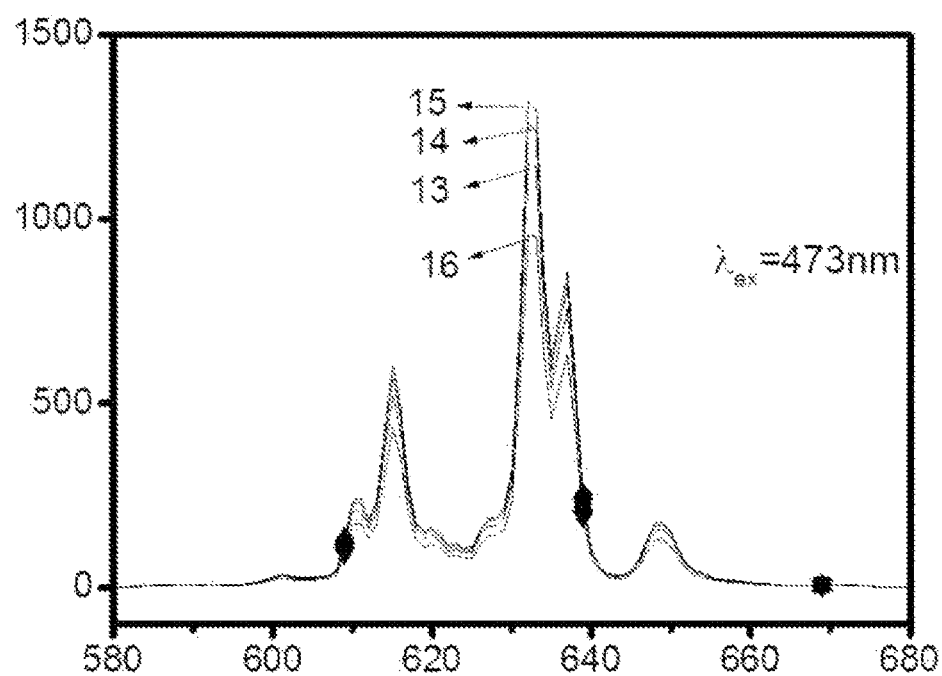
FIG. 5 is a test result of the emission intensity of products prepared in Embodiments 13 to 16 provided by an embodiment of the disclosure.
Figure 6:
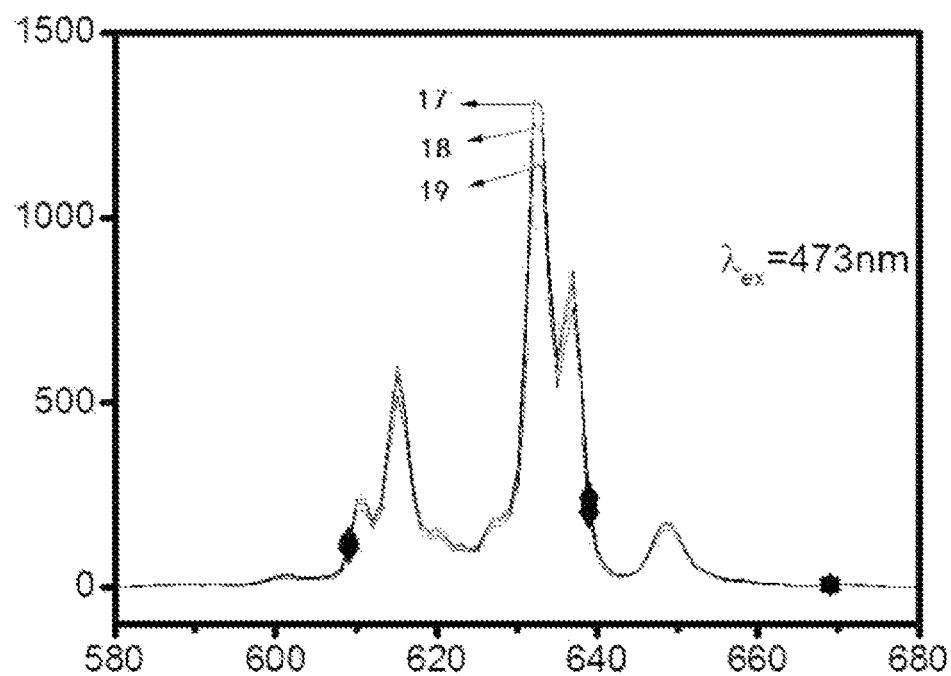
FIG. 6 is a test result of the emission intensity of products prepared in Embodiments 17 to 19 provided by an embodiment of the disclosure.

FIG. 2 is a test result of the emission intensity of products prepared in Embodiments 1 to 4 provided by an embodiment of the disclosure; FIG. 3 is a test result of the emission intensity of products prepared in Embodiments 5 to 8 provided by an embodiment of the disclosure; FIG. 4 is a test result of the emission intensity of products prepared in Embodiments 9 to 12 provided by an embodiment of the disclosure; FIG. 5 is a test result of the emission intensity of products prepared in Embodiments 13 to 16 provided by an embodiment of the disclosure; and FIG. 6 is a test result of the emission intensity of products prepared in Embodiments 17 to 19 provided by an embodiment of the disclosure.

In FIGS. 2 to 5, 1 represents the test result of the product prepared in Embodiment 1, and so on. It can be seen from FIGS. 2 to 5 that the luminous intensity of the products prepared in the embodiment of the disclosure is between 900 to 1300.

Figure 7:
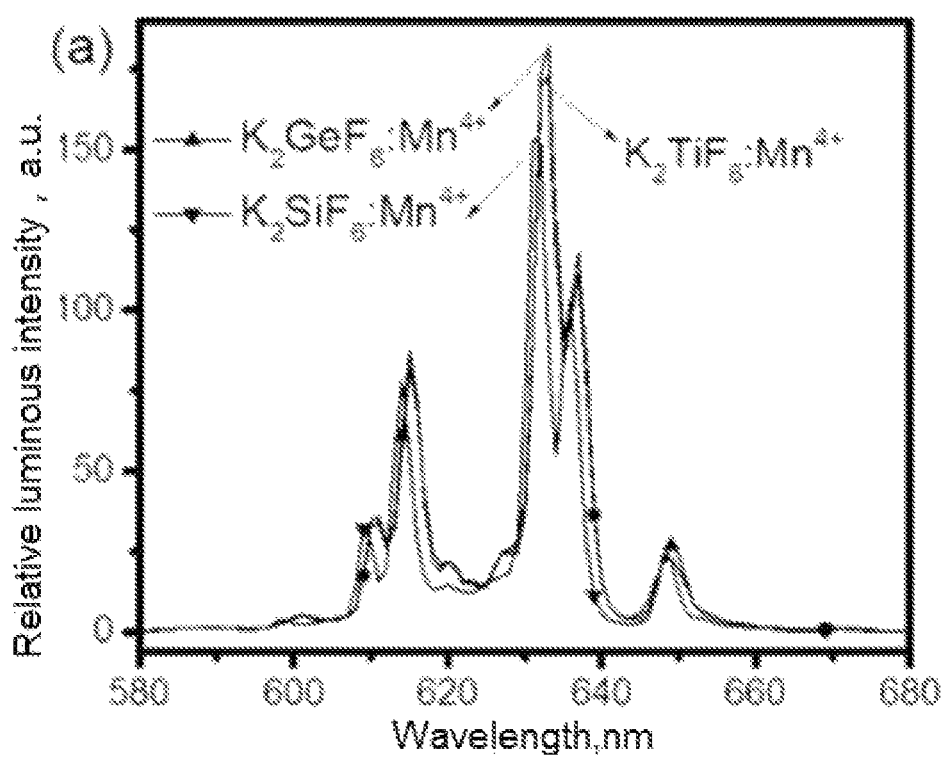
FIG. 7 is a schematic diagram of an emission spectrum of a material prepared in the embodiment of the disclosure and a contrast example provided by an embodiment of the disclosure.

A F4600 fluorescence spectrometer produced by Hitachi Manufacture Co., Ltd. is used to perform a relative luminous intensity test according to the above dosage, and FIG. 7 is a schematic diagram of an emission spectrum of a material prepared in the embodiment of the disclosure and a contrast example provided by an embodiment of the disclosure, as shown in FIG. 7, $K_2TiF_6:Mn^{4+}$ is an average value of the relative strength of the products prepared by using Embodiments 1 to 19 of the disclosure, and $K_2SiF_6:Mn^{4+}$ is KSF red powder (brand name BR-3011C) produced by Mitsubishi Chemical Corporation; $K_2GeF_6:Mn^{4+}$ is KGF red powder (brand name 690F-103B) produced by Advanced Material Research Co., Ltd. It is apparent that, through applying the embodiments of the disclosure, the dosage of phosphor can be reduced.

External Quantum Efficiency Comparison Test

A QY-2000-type integrating sphere fluorescence spectrometer produced by Tianjin Dongfang Kejie Technology Co., Ltd. is used to test the products prepared in Embodiments 1 to 19, the KSF ($K_2SiF_6:Mn^{4+}$) red powder (brand name BR-301/C) produced by Mitsubishi Chemical Corporation, and the KGF ($K_2GeF_6:Mn^{4+}$) red powder (brand name 690F-103B) produced by Grinm Advanced Materials Co., Ltd. Test results are as shown in Table 4.

Table 4 is a result comparison table of testing the products prepared in Embodiments 1 to 19, the KSF ($K_2SiF_6:Mn^{4+}$) red powder (brand name BR-301/C) produced by Mitsubishi Chemical Corporation, and the KGF ($K_2GeF_6:Mn^{4+}$) red powder (brand name 690F-103B) produced by Grinm Advanced Materials Co., Ltd. according to the embodiments of the disclosure.

TABLE 4

| Sample | External quantum yield (%) | Absolute quantum yield (%) | Light absorption efficiency (%) |
|---|---|---|---|
| Embodiment 1 | 69.61% | 91.08% | 74.24% |
| Embodiment 2 | 69.35% | 92.75% | 74.69% |
| Embodiment 3 | 69.09% | 93.06% | 74.24% |
| Embodiment 4 | 69.41% | 91.56% | 76.58% |
| Embodiment 5 | 69.51% | 91.57% | 77.34% |
| Embodiment 6 | 69.47% | 91.84% | 77.34% |
| Embodiment 7 | 69.46% | 92.04% | 76.53% |
| Embodiment 8 | 69.34% | 92.67% | 76.84% |
| Embodiment 9 | 69.54% | 91.42% | 76.28% |
| Embodiment 10 | 69.10% | 93.06% | 78.68% |
| Embodiment 11 | 69.34% | 91.43% | 78.24% |
| Embodiment 12 | 69.72% | 92.45% | 76.58% |
| Embodiment 13 | 69.91% | 93.54% | 77.34% |
| Embodiment 14 | 69.27% | 92.46% | 78.54% |
| Embodiment 15 | 69.35% | 91.57% | 76.35% |
| Embodiment 16 | 69.25% | 93.47% | 76.82% |
| Embodiment 17 | 69.34% | 93.54% | 76.24% |
| Embodiment 18 | 69.35% | 92.45% | 78.24% |
| Embodiment 19 | 69.47% | 92.04% | 75.28% |
| Grinm Advanced Materials Co., Ltd. | 66.87% | 100% | 66.87% |
| Mitsubishi Chemical Corporation | 56.10% | 85.57% | 65.56% |

It can be seen from Table 4 that the external quantum efficiency, absolute quantum efficiency and absorption rate of the products prepared in Embodiments 1 to 19 of the disclosure are all higher than the KSF red powder (brand name BR-301/C) produced by Mitsubishi Chemical Corporation and the KGF ($K_2GeF_6:Me$) red powder (brand name 690F-103B) produced by Grinm Advanced Materials Co., Ltd.

Phosphor Dosage Comparison Test

The products prepared in Embodiments 1 to 19, the KSF red powder (brand name BR-3011C) produced by Mitsubishi Chemical Corporation, and the KGF red powder (brand name 690F-103B) produced by Grinm Advanced Materials Co., Ltd. are used to be packaged into a white light LED device of a display backlight source, and a weight test is performed. Test results are as shown in Table 5.

Table 5 is a result comparison table of testing the products prepared in Embodiments 1 to 19, the KSF red powder (brand name BR-301/C) produced by Mitsubishi Chemical Corporation, and the KGF red powder (brand name 690F-103B) produced by Grinm Advanced Materials Co., Ltd. according to the embodiments of the disclosure.

TABLE 5

| Number | Dosage (g) | Theron green powder (g) | Packaging glue (g) |
|---|---|---|---|
| Embodiment 1 | 0.732 | 0.2874 | 2.5 |
| Embodiment 2 | 0.732 | 0.2874 | 2.5 |
| Embodiment 3 | 0.732 | 0.2874 | 2.5 |
| Embodiment 4 | 0.732 | 0.2874 | 2.5 |
| Embodiment 5 | 0.732 | 0.2874 | 2.5 |
| Embodiment 6 | 0.732 | 0.2874 | 2.5 |
| Embodiment 7 | 0.732 | 0.2874 | 2.5 |
| Embodiment 8 | 0.732 | 0.2874 | 2.5 |
| Embodiment 9 | 0.732 | 0.2874 | 2.5 |
| Embodiment 10 | 0.732 | 0.2874 | 2.5 |
| Embodiment 11 | 0.732 | 0.2874 | 2.5 |
| Embodiment 12 | 0.732 | 0.2874 | 2.5 |
| Embodiment 13 | 0.732 | 0.2874 | 2.5 |
| Embodiment 14 | 0.732 | 0.2874 | 2.5 |
| Embodiment 15 | 0.732 | 0.2874 | 2.5 |
| Embodiment 16 | 0.732 | 0.2874 | 2.5 |
| Embodiment 17 | 0.732 | 0.2874 | 2.5 |
| Embodiment 18 | 0.732 | 0.2874 | 2.5 |
| Embodiment 19 | 0.732 | 0.2874 | 2.5 |
| Grinm Advanced Materials Co., Ltd. | 0.972 | 0.2874 | 2.5 |
| Mitsubishi Chemical Corporation | 0.972 | 0.2874 | 2.5 |

It can be seen from Table 5 that the amounts of the products prepared in Embodiments 1 to 19 of the disclosure are all less than that of the KSF red powder (brand name BR-301/C) produced by Mitsubishi Chemical Corporation, and the KGF red powder (brand name 690F-103B) produced by Grinm Advanced Materials Co., Ltd.

The above are only the preferred embodiments of the disclosure, and are not intended to limit the disclosure. Any modifications, equivalent replacements and improvements and the like made within the spirit and principle of the disclosure shall be included in a scope of protection of the disclosure.

What is claimed is:

1. A preparation method for manganese-doped red phosphor, wherein the method comprises:
   1) mixing $A_2BF_6$ polycrystalline particles with grinding balls, wherein a mass ratio of the $A_2BF_6$ polycrystalline particles to the grinding balls is 1:1 to 1:2.5, and then ball-milling for 30 minutes to 120 minutes, wherein A is a monovalent cation, at least one selected from the group consisting of a potassium ion, a hydrogen ion, a lithium ion, a sodium ion and a cesium ion, and B is a tetravalent cation, at least one selected from the group consisting of a titanium ion a silicon ion, a germanium ion, a tin ion, and a zirconium ion;
   2) secondary crystallization treatment: mixing $A_2BF_6$ powder obtained after ball-milling with a hydrofluoric acid, a mass concentration of the hydrofluoric acid is 30% to 59%, wherein a mass ratio of the $A_2BF_6$ powder obtained after ball-milling to the hydrofluoric acid is 1:1 to 2.5:1, and then at a revolving speed of 1 RPM to 1200 RPMs, stirring for 12 hours to 72 hours;
   3) filtering out solid particles in $A_2BF_6$ and hydrofluoric acid solution after the secondary crystallization treatment, to obtain secondary crystallization $A_2BF_6$ particles;
   4) according to a molar ratio of $A_2BF_6$ and $A_2MnF_6$ which is 93:7 to 90:10, weighing the secondary crystallization $A_2BF_6$ particles and $A_2MnF_6$, and then firstly dissolving $A_2MnF_6$ in a hydrofluoric acid, a mass concentration of the hydrofluoric acid is 30% to 59%, and then adding the secondary crystallization $A_2BF_6$ particles to a solution comprising the $A_2MnF_6$ and the hydrofluoric acid, and continuously stirring for 10 minutes to 360 minutes for ion exchange, wherein a ratio of a total mass of $A_2BF_6$ and $A_2MnF_6$ to a mass of the hydrofluoric acid is 1:1 to 4:1; and
   5) filtering out solid particles in solution after the ion exchange, to obtain a filter cake, and then drying the filter cake to obtain the manganese-doped red phosphor.

2. The preparation method for the manganese-doped red phosphor according to claim 1, wherein the secondary crystallization treatment in the step 2) is performed in a sealed reactor.

3. The preparation method for the manganese-doped red phosphor according to claim 1, wherein the step 3) comprises:
   under conditions of a vacuum degree of 60 Pa to 200 Pa and a flow rate of 60 L/min to 100 L/min, performing vacuum suction filtration treatment on the $A_2BF_6$ and hydrofluoric acid solution after the secondary crystallization treatment, to obtain the secondary crystallization $A_2BF_6$ particles.

4. The preparation method for the manganese-doped red phosphor according to claim 1, wherein a preparation method for $A_2MnF_6$ in the step 4) comprises:
   A: dissolving potassium hydrogen fluoride in a hydrofluoric acid, a mass concentration of the hydrofluoric acid is 30% to 59%, wherein a mass ratio of the potassium hydrogen fluoride to the hydrofluoric acid is 2:10 to 4:10; and at a revolving speed of 10 RPM to 1000 RPM, stirring for 15 minutes to 40 minutes;
   B: adding potassium permanganate while stirring, wherein a mass ratio of the potassium permanganate to the potassium hydrogen fluoride is 1:5 to 2:5;
   C: using a hydrogen peroxide to titrate solution after adding the potassium permanganate to be golden yellow, a mass concentration of the hydrogen peroxide is 25% to 40%;
   D: putting the titrated solution together with a reactor into an ice-water mixture at 0° C. to 5° C. and standing for 15 minutes to 40 minutes, filtering out a precipitate, and then using acetone to repeatedly wash the precipitate to be neutral; and
   E: drying the washed precipitate for 1 hour to 4 hours under conditions of a temperature of 60° C. to 90° C. and a vacuum degree of 90 Pa to 500 Pa, to obtain $A_2MnF_6$.

5. The preparation method for the manganese-doped red phosphor according to claim 1, wherein the step 5) comprises:
   under conditions of a vacuum degree of 60 Pa to 200 Pa and a flow rate of 60 L/min to 100 L/min, performing vacuum suction filtration treatment on the solution after ion exchange, to obtain a filter cake, and then using acetone to repeatedly wash the filter cake to be neutral, and then drying the filter cake for 1 hour to 4 hours under conditions of a temperature of 60° C. to 90° C. and a vacuum of 90 Pa to 500 Pa, to obtain the manganese-doped red phosphor.

* * * * *